(12) United States Patent
Nishikawa (10) Patent No.: US 7,098,592 B2
(45) Date of Patent: Aug. 29, 2006

(54) ELECTROLUMINESCENT DISPLAY DEVICE

(75) Inventor: Ryuji Nishikawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 162 days.

(21) Appl. No.: 10/981,752

(22) Filed: Nov. 5, 2004

(65) Prior Publication Data

US 2005/0168134 A1    Aug. 4, 2005

(30) Foreign Application Priority Data

Dec. 10, 2003    (JP)    ............................. 2003-411617

(51) Int. Cl.
*G09G 5/00*    (2006.01)
*H05B 33/00*    (2006.01)

(52) U.S. Cl. ...................... 313/506; 313/507; 345/173; 345/175

(58) Field of Classification Search ................ 313/506, 313/507; 345/173, 175
See application file for complete search history.

(56) References Cited

U.S. PATENT DOCUMENTS

2004/0212603 A1* 10/2004 Cok ........................... 345/175

FOREIGN PATENT DOCUMENTS

| JP | 2002-175029 | 6/2002 |
| JP | 2002-214583 | 7/2002 |

* cited by examiner

*Primary Examiner*—Joseph Williams
*Assistant Examiner*—Anthony Perry
(74) *Attorney, Agent, or Firm*—Morrison & Foerster LLP (57) ABSTRACT

In an organic electroluminescent display device having a touch panel function, the number of components is reduced and accuracy in positional detection of a pointing object is improved. A display portion, and light source portions and detecting portions respectively formed along sides of the display portion are formed on a same substrate to form a display panel. Then, first reflecting boards which reflect light emitted by the light source portions in a horizontal direction along an emissive surface of the display portion, and second reflecting boards which reflect the light reflected by the first reflecting boards and enters the light in the light detecting portions through a back surface of the display portion are respectively formed at ends of a storage capacitor of a display panel.

7 Claims, 6 Drawing Sheets

ELECTROLUMINESCENT DISPLAY DEVICE

CROSS-REFERENCE OF THE INVENTION

This invention is based on Japanese Patent Application No. 2003-411617, the content of which is incorporated by reference in its entirety.

BACKGROUND OF THE INVENTION

1. Field of the Invention

This invention relates to an electroluminescent display device, particularly to such a device having a touch panel function.

2. Description of the Related Art

In recent years, organic electroluminescent (hereafter, referred to as EL) display devices using EL elements have been receiving attention as a display device substituting for a CRT or an LCD. Particularly, an organic EL display device having thin film transistors (hereafter, referred to as TFTs) as switching elements for driving the organic EL elements has been developed.

The LCD has a wide range of applications, for example, from displays for cellular phones and to those for personal digital assistants. Furthermore, a touch panel used with a finger or a pen-type pointing device has been developed.

Such technologies are described in Japanese Patent Application Publication Nos. 2002-175029 and 2002-214583. However, the organic EL display device has not been applied to touch panels used with the finger or the pen-type pointing device.

SUMMARY OF THE INVENTION

This invention provides an organic EL display device having a touch panel function, and is directed to improving accuracy in positional detection on a display portion of such an organic EL display device.

The invention provides an electroluminescent display device that includes a display portion having a plurality of display pixels arranged in a matrix. Each of the pixels has a display electroluminescent element and a driving transistor driving the display electroluminescent element. The device also includes a light source portion having a plurality of light source electroluminescent elements and provided along a first side of the display portion and a light detecting portion having a plurality of light sensors and provided along a second side of the display portion. The second side is opposite from the first side. The device further includes a first reflecting board reflecting light emitted by the light source portion in a horizontal direction along a front surface of the display portion and a second reflecting board reflecting the light reflected by the first reflecting board so as to lead the light into the light detecting portion through a back surface of the display portion.

DETAILED DESCRIPTION OF THE INVENTION

Figure 1A:
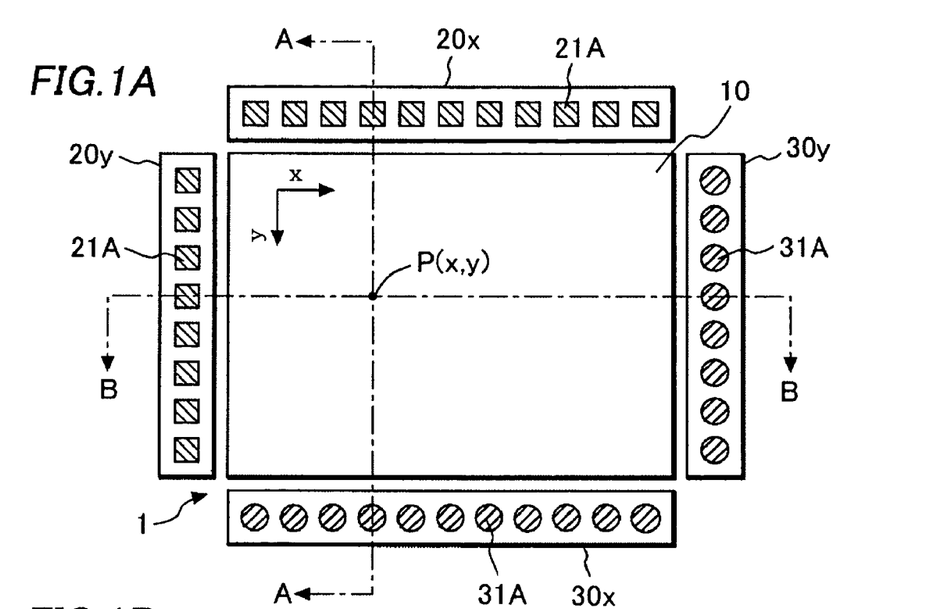
FIG. 1A is a plan view of an organic EL display device of a first embodiment of the invention.

FIG. 1A is a plan view of the organic EL display device of a first embodiment of the invention. In this embodiment, a plurality of display pixels PEL (shown in FIG. 4) is arrayed in a matrix in a display portion 10 of a display panel 1. Each of the display pixels PEL has a display organic EL element 11A (e.g. top emission type organic EL element), a pixel selecting TFT (e.g. top gate type TFT) (not shown) selecting the display pixel PEL, a driving TFT 61A (e.g. top gate type TFT) driving the display organic EL element 11A, and so on.

As shown in FIG. 1A, the display portion 10 is shaped in a rectangle in the plan view. A first side and a second side of the display portion 10 in the plan view respectively correspond to an x coordinate and a y coordinate of a rectangular coordinate system formed of x and y axes. A light source portion 20x is placed along the side on the x axis. A plurality of light source organic EL elements 21A (e.g. top emission type organic EL element) is aligned in the light source portion 20x. Furthermore, a light detecting portion 30x is provided along a side opposite from the light source portion 20x. A plurality of light sensors 31A (e.g. top gate type TFT) is aligned in the light detecting portion 30x. The light sensor 31A generates a predetermined current or voltage when receiving light, and the current or the voltage is electrically detected so that the light can be detected.

Similarly, a light source portion 20y is placed along a side on a y-axis of the display portion 10. A plurality of light source organic EL elements 21A (e.g. top emission type organic EL element) is aligned in the light source portion 20y. A light detecting portion 30y is provided along a side opposite from the light source portion 20y. A plurality of light sensors 31A (e.g. top gate type TFT) is aligned in the light detecting portion 30y.

Figure 1B:
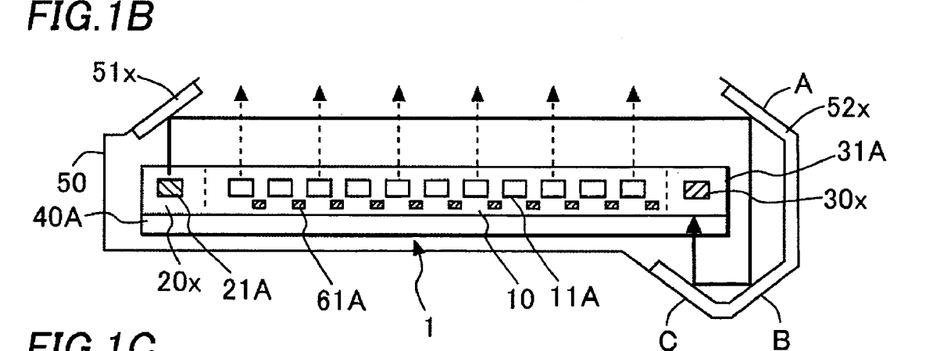
FIG. 1B is a schematic cross-sectional view of FIG. 1A along line A—A.

Next, a structure of a display panel 1 will be described with reference to a cross-sectional view thereof. FIG. 1B is a schematic cross-sectional view of FIG. 1A along line A—A, and FIG. 1C is a schematic cross-sectional view of FIG. 1A along line B—B.

Figure 1C:
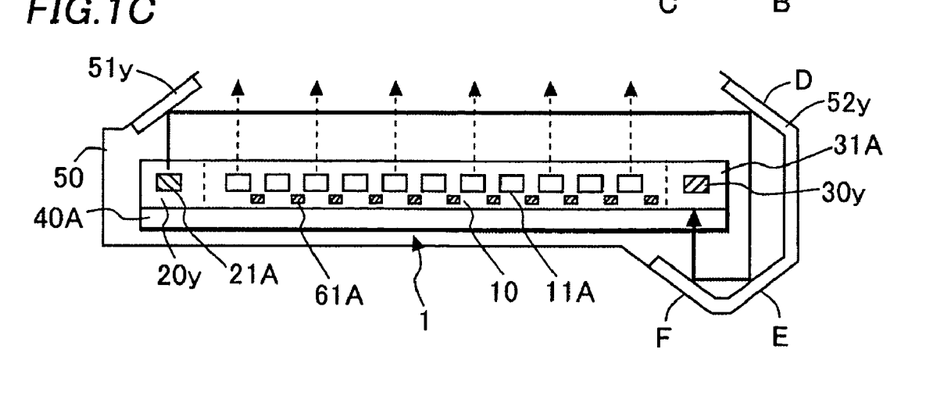
FIG. 1C is a schematic cross-sectional view of FIG. 1A along line B—B.

As shown in FIGS. 1B and 1C, the display portion 10, the light source portions 20x and 20y, and the light detecting portions 30x and 30y are provided on the same transparent glass substrate 40A, being integrally formed as a display panel 1. The light source organic EL elements 21A of the light source portions 20x and 20y have the same structure (a structure of a top emission type organic EL element outputting light toward the direction opposite from the transparent glass substrate 40A) as that of the display organic EL elements 11A of the display portion 10 so that the light source organic EL elements 21A and the display organic EL elements 11A are formed by the same manufacturing steps. Furthermore, the light sensors 31A of the light detecting portions 30x and 30y can be formed of TFTs so that the light sensors 31A can be formed by the same manufacturing steps as the steps for manufacturing the pixel selecting TFTs and the driving TFTs 61A in the display portion 10. This reduces the number of components in the organic EL display device, preventing complexity of manufacturing steps.

This display panel 1 is placed in a container 50, and the display portion 10 is exposed through a window of the container 50. This display panel 1 is thus configured to emit display light of the display portion 10.

A light reflecting board 51x for reflecting light is provided above the light source portion 20x inside the container 50 along a side of an x-axis of the display portion 10. The light reflecting board 51x reflects light, which is emitted in a vertical direction through a front surface of the display panel 1 from the light source organic EL element 21A of the light source portion 20x, in a horizontal direction along the front surface of the display panel 1.

Furthermore, near the light detecting portion 30x inside the container 50, a reflecting board 52x is provided so as to cover an edge portion of the display panel 1, which contains the light sensors 31A, as shown in FIG. 1B.

an upper side and a lower side of the light detecting portion 30x from the side. The reflecting board 52x is formed having three reflecting surfaces A, B, and C having predetermined reflecting angles. This reflecting board 52x reflects light, which is incident horizontally along the front surface of the display panel 1, in a vertical direction (toward backside direction of the light detecting portion 30x) by the reflecting surface A above the light detecting portion 30x. Furthermore, this reflected light is reflected in a horizontal direction along the back surface of the display panel 1 and then in a vertical direction (toward the front side direction of the light detecting portion 30x) by the reflecting surface B and the reflecting surface C respectively, which are a part of the reflecting board 52x placed below the light detecting portion 30x. In this embodiment, all the reflecting angles are different.

When the light, which is emitted by the light source portion 20x and reflected in a horizontal direction along the front surface of the display panel 1 by the reflecting board 51x, is not blocked by a pointing object (not shown) such as a pen or a finger which touches or is placed close to the display portion 10, the light is further reflected by the light reflecting board 52x and enters the first light detecting portion 30x through the back surface of the display panel 1. The reflecting board 52x is formed inside the container 50 which no external light enters, and each of the reflecting surfaces has such a predetermined reflecting angle that only light reflected in a horizontal direction along the front surface of the display panel 1 can enter the light detecting portion 30x. Therefore, external light incident at an angle different from the angle of the horizontal front surface of the display panel 1 does not enter the light detecting portion 30x.

Similarly, a light reflecting board 51y for reflecting light is provided above the light source portion 20y inside the container 50 along a side of a y-axis of the display portion 10. The light reflecting board 51y reflects light, which is emitted in a vertical direction through the front surface of the display panel 1 from the light source organic EL element 21A of the light source portion 20y, in a horizontal direction along the front surface of the display panel 1.

Furthermore, near the light detecting portion 30y inside the container 50, a reflecting board 52y is provided so as to cover the edge of the display portion 1. The reflecting board 52y has three reflecting surfaces D, E, and F having predetermined reflecting angles. This reflecting board 52y reflects light, which is incident horizontally along the front surface of the display panel 1, in the vertical direction by the reflecting surface D above the light detecting portion 30y. Furthermore, this reflected light is reflected in the horizontal direction along the back surface of the display panel 1 and then in a vertical direction by the reflecting surface E and the reflecting surface F respectively, which are a part of the reflecting board 52y placed below the light detecting portion 30y.

When the light, which is emitted by the light source portion 20y and reflected in the horizontal direction along the front surface of the display panel 1 by the reflecting board 51y, is not blocked by a pointing object such as a pen or a finger which touches or is placed close to the display portion 10, the light is further reflected by the light reflecting board 52y and enters the light detecting portion 30y through the back surface of the display panel 1. The reflecting board 52y is formed inside the container 50 which no external light enters, and each of the reflecting surfaces has such a predetermined reflecting angle that only light reflected in a horizontal direction along the front surface of the display panel 1 can enter the light detecting portion 30y. Therefore, external light incident at an angle different from the angle of the horizontal front surface of the display panel 1 does not enter the light detecting portion 30y.

Next, a detection process of a point P corresponding to a position where the pointing object such as a pen or a finger touches or is placed close to the display portion 10 will be described with reference to FIGS. 1A, 1B, and 1C. The coordinates (x, y) of this point P are determined as follows. Assume that the x coordinate corresponds to the first side of the display portion 10, and the y coordinate corresponds to the second side of the display portion 10. Furthermore, light emitted from each of the light source organic EL elements 21A of the light source portions 20x and 20y has directivity similar to those of laser beams.

First, the x coordinate of the point P is determined as described below. Light emitted in a vertical direction through the front surface of the display panel 1 from the light source organic EL element 21A of the light source potion 20x is reflected in a horizontal direction along the front surface of the display panel 1 by the reflecting board 51x. The light reflected in a horizontal direction along the front surface of the display panel 1 is reflected in the vertical direction relative to the front surface of the display panel 1 by the reflecting surface A formed in the reflecting board 52x above the light detecting portion 30x, when the light is not blocked by the pointing object touching or placed close to the display portion 10. This reflected light is reflected in a horizontal direction again by the reflecting surface B of the reflecting board 52x below the light detecting portion 30x. Then, the light is reflected in the vertical direction by the reflecting surface C.

Therefore, the light emitted from the light source portion 20x enters the light detecting portion 30x through a backside of the display panel 1 and is detected by the corresponding light sensor 31A, when the light is not blocked by the pointing object. On the other hand, when the pointing object touches or is placed close to the display portion 10, the light emitted from the light source portion 20x is blocked by the pointing object, so that the light sensor 31A corresponding to this position does not detect the light. Therefore, the position of this light sensor 31A which does not detect the light corresponds to the x coordinate of the point P on the display portion 10.

The reflecting board 52x is formed inside the container 50 which no external light enters, and each of the reflecting surfaces A, B, and C has such a predetermined reflecting angle that only light reflected in the horizontal direction along the front surface of the display panel 1 can enter the light detecting portion 30x. Therefore, external light incident at an angle different from the angle of the horizontal front surface of the display panel 1 is not detected by the light sensor 31A of the light detecting portion 30x. This can reduce detection errors caused by external light, and improve accuracy in detection of the x coordinate of the point P.

Similarly, the y coordinate of the point P is determined as described below. Light emitted in a vertical direction through the front surface of the display panel 1 from the light source organic EL element 21A of the light source potion 20y is reflected in a horizontal direction along the front surface of the display panel 1 by the reflecting board 51y. The light reflected in a horizontal direction along the front surface of the display panel 1 is reflected in the vertical direction relative to the front surface of the display panel 1 by the reflecting surface D formed in the reflecting board 52y above the light detecting portion 30y, when the light is not blocked by the pointing object touching or placed close to the display portion 10. This reflected light is reflected in a horizontal direction again by the reflecting surface E of the reflecting board 52y below the light detecting portion 30y. Then, the light is reflected in the vertical direction by the reflecting surface F.

Therefore, the light emitted from the light source portion 20y enters the light detecting portion 30y through the back surface of the display panel 1 and is detected by the corresponding light sensor 31A, when the light is not blocked by the pointing object. On the other hand, when the pointing object touches or is placed close to the display portion 10, the light emitted from the light source portion 20y is blocked by the pointing object, so that the light sensor 31A corresponding to this position does not detect the light. Therefore, the position of this light sensor 31A which does not detect the light corresponds to the y coordinate of the point P on the display portion 10.

The reflecting board 52y is formed inside the container 50 which no external light enters, and each of the reflecting surfaces D, E, and F has such a predetermined reflecting angle that only light reflected in the horizontal direction along the front surface of the display panel 1 can enter the light detecting portion 30y. Therefore, external light incident at an angle different from the angle of the horizontal surface of the display panel 1 is not detected by the light sensor 31A of the light detecting portion 30y. This can reduce detection errors caused by external light, and improve accuracy in detection of the y coordinate of the point P.

When light emitted from each of the light source organic EL elements 21A of the light source portions 20x and 20y does not have directivity similar to those of laser beams, the x and y coordinates of the point P (x, y) can be determined as described below.

That is, the x and y coordinates of the point P (x, y) are determined by sequentially switching the light source organic EL elements for emitting light, and by monitoring the positions of the light sensors which do not detect the light each time. A process of determining the x and y coordinates of the point P (x, y) in this case will be described with reference to FIGS. 2A, 2B, and 2C.

Figure 2A:
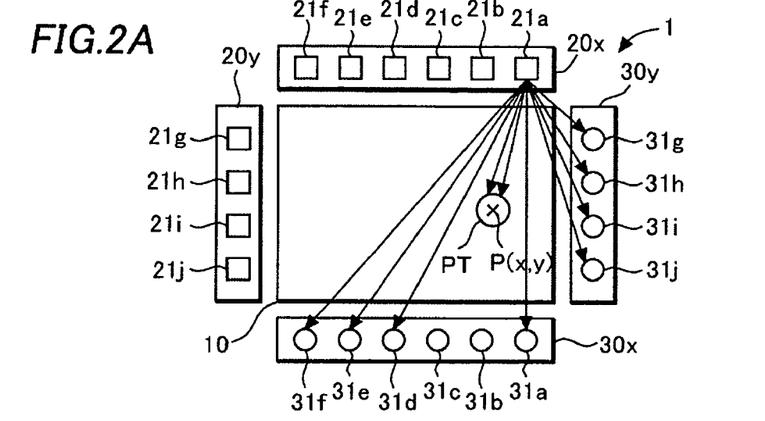
FIGS. 2A, 2B, and 2C are schematic plan views of a display panel showing an operation of the organic EL display device of FIGS. 1A, 1B, and 1C.
Figure 2B:
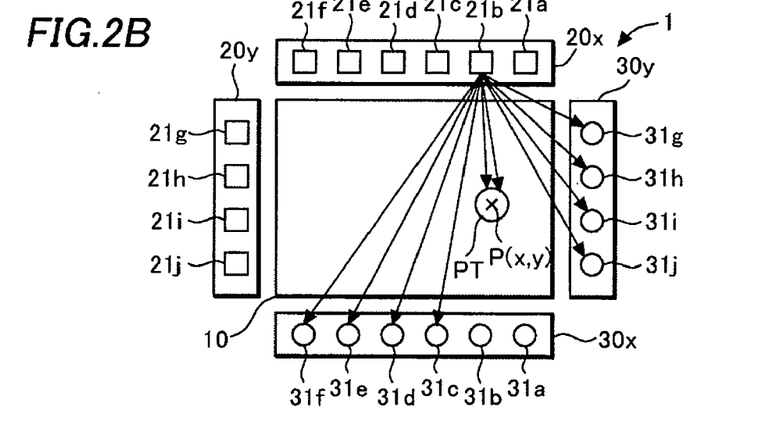
Figure 2C:
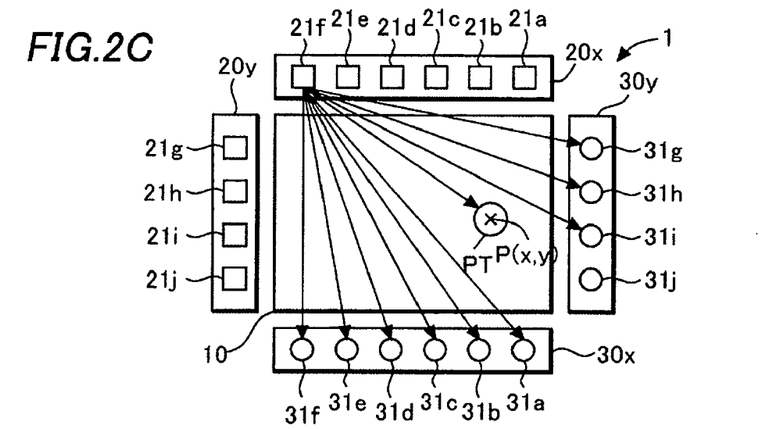

FIGS. 2A, 2B, and 2C are schematic plan views of the display panel 1 explaining an example of the process of determining the x and y coordinates of the point P (x, y) under the divergent light source. In FIGS. 2A, 2B and 2C, the numbers of the light source organic EL elements and the light sensors are smaller than the numbers shown in FIG. 1A for simplifying description.

As shown in FIG. 2A, light is emitted in the vertical direction through a transparent glass substrate 40A (not shown) from a light source organic EL element 21 a provided in one end of the first light source portion 20x. This light is reflected in the horizontal direction along the transparent glass substrate 40A by the light reflecting board 51x (not shown) provided above the light source portion 20x. In a position where the light reflected in the horizontal direction is not blocked by the pointing object PT, the light is then reflected in the backside direction of the display panel 1 by the light reflecting board 52x (not shown) provided above the light detecting portion 30x to enter the light detecting portion 30x. Furthermore, the light is reflected in the backside direction of the display panel 1 by the light reflecting board 52y (not shown) provided above the light detecting portion 30y to enter the light detecting portion 30y.

The light entering the light detecting portions 30x and 30y is detected by the light sensors corresponding to positions where the light enters (light sensors 31a, 31d, 31e, 31f, 31g, 31h, 31i, and 31j in an example of FIG. 2A).

On the other hand, where the light reflected in a horizontal direction is blocked by the pointing object PT, the light does not enter the light detecting portions 30x and 30y. That is, the light sensors (light sensors 31b and 31c in an example of FIG. 2A) corresponding to the positions where the light does not enter do not detect the light.

Accordingly, the light sensors which do not detect the light are searched among the light sensors of the light detecting portions 30x and 30y, and x coordinates or y coordinates of those light sensors are stored in a storage medium (not shown) such as a memory. When this operation is completed, the light source organic EL element 21a is turned off the light.

Next, as shown in FIG. 2B, light is emitted from a light source organic EL element 21b adjacent the light source organic EL element 21a. Then, x coordinates or y coordinates of the light sensors (light sensors 31a and 31b in an example of FIG. 2B) which do not detect the light 20 among the light sensors of the light detecting portions 30x and 30y are stored in the memory (not shown) and so on. When this operation is completed, the light source organic EL element 21b is turned off the light.

Similarly, light source organic EL elements 21c, 21d, 21e and 21f placed adjacent each other in the light source portion 20x are sequentially switched to emit light and turn off the light. The light sensors which do not detect the light are searched each time, and x coordinates or y coordinates of the light sensors are stored in the memory (not shown) and so on. As shown in FIG. 2C, when light is emitted from the light source organic EL element 21f, an x coordinate or a y coordinate of the light sensor (light sensor 31j in an example of FIG. 2C) which does not detect the light is stored in the memory (not shown) and so on.

After a sequence of light emission and turn-off is completed from the light source organic EL element 21a provided on one end of the light source portion 20x to the light source organic EL element 21f provided on another end thereof, the light emission and turn-off in the light source portion 20y are sequentially performed from the light source organic EL element 21g provided on one end thereof to the light source organic EL element 21j provided on another end thereof. At each operation, the light sensors which do not detect the light are searched in the light detecting portions 30x and 30y, and x or y coordinates corresponding to the light sensors are monitored and stored in the memory and so on (not shown).

As described above, the light sensors of the light detecting portions 30x and 30y, which do not detect the light emitted from the light source portions 20x and 20y, are searched. The x coordinate or the y coordinate corresponding to each of the detected light sensors is monitored each time, and stored in the memory (not shown) and so on.

Then, the x or y coordinates of the light sensors which do not detect the light, which are monitored and stored each time, are all used to determine the x and y coordinates of the point P (x, y) representing the location of the pointing object PT that touches or is placed close to the display portion 10. Then, the data stored in the memory and so on are initialized for next detection of the point P (x, y).

Figure 3:
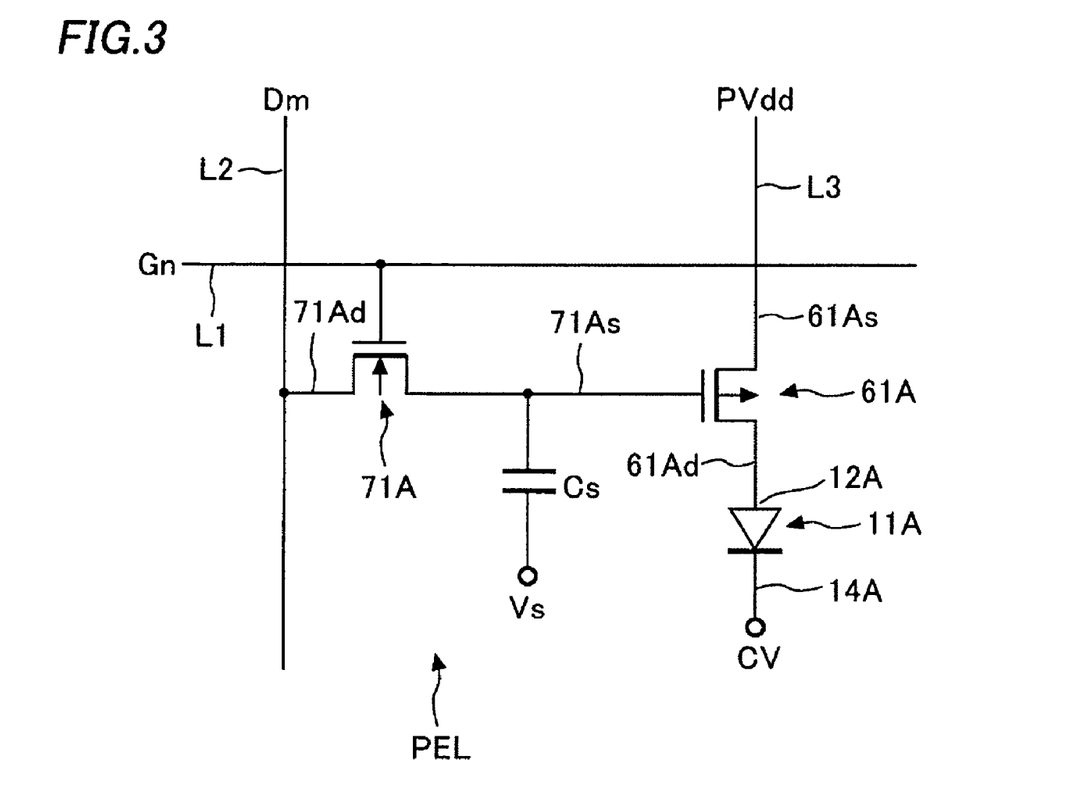
FIG. 3 is an equivalent circuit diagram of a display pixel of the organic EL display device of the first embodiment of the invention.

Next, a structure of a display pixel PEL having the display organic EL element 11A and so on will be described in detail with reference to drawings. FIG. 3 shows an equivalent circuit diagram of the display pixels PEL disposed in a matrix on the display portion 10. It is noted that FIG. 3 shows one display pixel PEL only.

A gate signal line L1 supplying a gate signal Gn for selecting the display pixels PEL and a drain signal line L2 supplying a display signal Dm for each of the display pixels PEL are crossing each other in the display pixel PEL. An organic EL element 11A serving as a self-emissive element, a driving TFT 61A for supplying a current to the organic EL element 11A, and a pixel selecting TFT 71A for selecting the display pixel PEL are disposed in a region enclosed with these signal lines.

A gate of the pixel selecting TFT 71A is connected with the gate signal line L1 and supplied with the gate signal Gn therefrom, and a drain 71Ad of the pixel selecting TFT 71A is connected with the drain signal line L2 and supplied with the display signal Dm therefrom. A source 71As of the pixel selecting TFT 71A is connected with a gate of the driving TFT 61A. A source 61As of the driving TFT 61A is supplied with a positive power supply voltage PVdd from a power supply line L3. A drain 61Ad of the driving TFT 61A is connected with an anode 12A of the organic EL element 11A. A transparent cathode 14A of the organic EL element 11A is supplied with a power supply voltage CV.

The gate signal Gn is outputted from a vertical driver circuit (not shown) for switching the display pixel PEL in a vertical direction. The display signal Dm is outputted from a horizontal driver circuit (not shown) for controlling displays of the display pixels PEL arrayed in a horizontal direction.

The gate of the driving TFT 61A is connected with a storage capacitor Cs. The storage capacitor Cs is provided to store the display signal Dm to be supplied to the display pixel PEL for a field period by storing electric charge corresponding to the display signal Dm.

The display pixel PEL described above is operated as follows. When the gate signal Gn becomes high level for one horizontal period, the pixel selecting TFT 71A turns on. Then, the display signal Dm is applied from the drain signal line L2 to the gate of the driving TFT 61A through the pixel selecting TFT 71A. Conductance of the driving TFT 61A changes in accordance with the display signal Dm supplied to the gate thereof, and a drive current in accordance with the conductance is supplied to the organic EL element 11A through the driving TFT 61A, thereby lighting the organic EL element 11A. When the driving TFT 61A turns off in accordance with the display signal Dm supplied to the gate, an electric current does not flow in the driving TFT 61A, thereby turning off the light of the organic EL element 11A.

Figure 4:
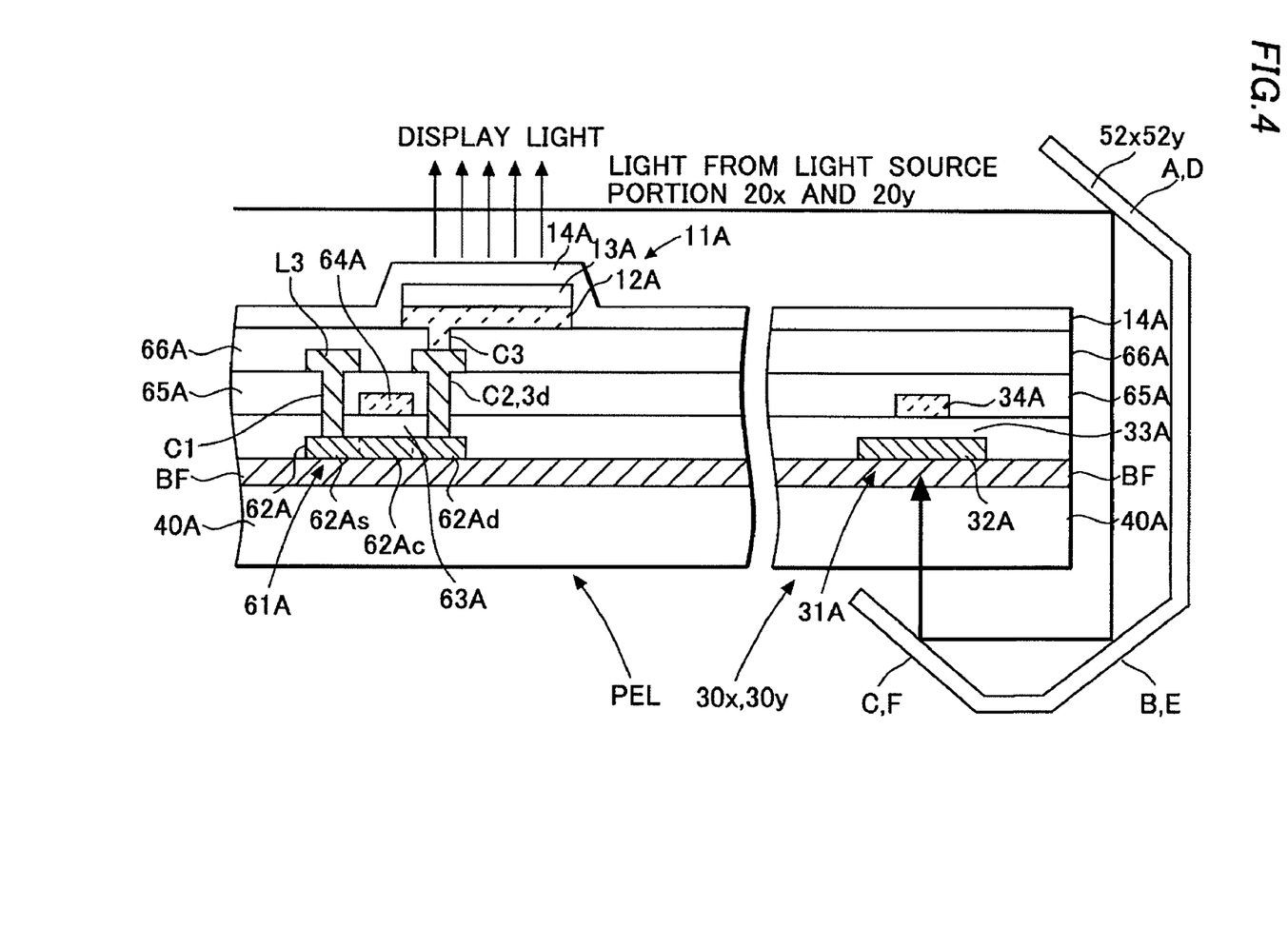
FIG. 4 is a schematic cross-sectional view of a display organic EL element and a light sensor of the first embodiment of the invention.

Next, structures of the display organic EL element 11A, the driving TFT 61A, and the light sensor 31A of the display pixel PEL will be described with reference to a schematic cross-sectional view in detail.

FIG. 4 is a schematic cross-sectional view of the display organic EL element 11A and the driving TFT 61A of the display pixel PEL, and the light sensor 31A of the light detecting portions 30x and 30y and its neighborhood. FIG. 4 shows one of the display pixels PEL arrayed in a matrix on the display portion 10. The display organic EL element 11A of the display pixel PEL is of top emission type, and the driving TFT 61A for driving the display organic EL element 11A is of top gate type. Although not shown, the pixel selecting TFT 71A is of top gate type like the driving TFT 61A. The light sensor 31A is formed of a top gate type TFT.

These display organic EL element 11A, the driving TFT 61A, the pixel selecting TFT 71A, and the light sensor 31A are disposed on the same glass substrate 40A. A configuration of these elements will be described in detail hereafter.

A buffer layer BF formed by laminating, for example, $SiN_x$ and $SiO_2$ in this order, an active layer 62A formed by poly-crystallizing an a-Si film by laser beam irradiation, a gate insulating film 63A, and a gate electrode 64A made of metal having a high melting point such as chromium or molybdenum are formed on the transparent glass substrate 40A, in this order. A channel 62Ac, a source 62As, and a drain 62Ad are provided in the active layer 62A, the source 62As and the drain 62Ad being disposed on sides of the channel 62Ac respectively.

An interlayer insulating film 65A laminated with an $SiO_2$ film, an $SiN_x$ film, and an $SiO_2$ film in this order is formed on the whole surfaces of the gate insulating film 63A and the gate electrode 64A. A contact hole C1 is provided in the interlayer insulating film 65A in a position corresponding to the source 62As, and the power supply line L3 to be supplied with a positive power supply voltage PVdd is provided therein by filling metal such as Al therein.

A contact hole C2 is provided in the interlayer insulating film 65A in a position corresponding to the drain 62Ad, and a drain electrode 3d is provided therein by filling the hole with a metal such as Al therein. Furthermore, a planarization insulating film 66A made of, for example, organic resin and planarizing a surface is provided on the whole surface. A contact hole C3 is provided in the planarization insulting film 66A in a position corresponding to the drain electrode 3d, and metal such as Al fills the hole so that the drain electrode 3d and the anode 12A of the display organic EL element 11A are in contact with each other. The anode 12A is an electrode having characteristics of reflecting light without transmission. The anode 12A is formed of Al and other metals, but can be formed of a single metal layer having a high reflectance, or a multilayered structure of ITO (indium tin oxide) and metal.

The display organic EL element 11A is formed in each of the display pixels PEL, being isolated as an island. This display organic EL element 11A is formed by laminating the anode 12A, an emissive layer 13A, and the transparent cathode 14A transmitting light emitted from the emissive layer 13A, in this order. The transparent cathode 14A is supplied with a power supply voltage CV (not shown). In this display organic EL element 11A, holes injected from the anode 12A and electrons injected from the transparent cathode 14A are recombined in the emissive layer 13A. The recombined holes and electrons excite organic molecules forming the emissive layer 13A to generate excitons. Then, light is emitted from the emissive layer 13A in a process of radiation of the excitons and released outside from the transparent cathode 14A, completing light emission.

The light sensor 31A is disposed on the transparent glass substrate 40A, which is also formed with the driving TFT 61A and the display organic EL element 11A, in a position corresponding to the light detecting portions 30x and 30y. The light sensor 31A is formed of a top gate type TFT.

That is, the buffer layer BF formed by laminating, for example, $SiN_x$ and $SiO_2$ in this order, the active layer 32A formed by poly-crystallizing an a-Si film by laser beam irradiation, the gate insulating film 33A, the gate electrode 34A made of metal having a high melting point such as chromium or molybdenum, the interlayer insulating film 65A, and the planarization insulating film 66A are formed on the transparent glass substrate 40A, in this order. Furthermore, the transparent cathode 14A of the display organic EL element 11A can be extended on the planarization insulating film 66A. In this case, external light can be blocked from entering a back surface of the light sensor 31A.

Light from the light source portions 20x and 20y enters the active layer 32A through the back surface of the display panel 1, i.e. through an exposed surface of the transparent glass substrate 40A. The light sensor 31A electrically detects the light received by the active layer 32A, and outputs an electric current or a voltage corresponding to intensity of the light.

In the structure of this light sensor 31A, the gate electrode 34A for blocking light does not exist between the transparent glass substrate 40A where light enters and the active layer 32A. This increases an area of the active layer 32A receiving light and improves sensitivity in light detection compared with the case where the light sensor 31A is formed of a bottom gate type TFT (laminated with the transparent glass substrate, the gate electrode, the gate insulating film, and the active layer, in this order).

Furthermore, the driving TFT 61A and the light sensor 31A are formed of the top gate type TFTs so that these can be formed by the same steps, thereby preventing complexity of manufacturing steps. For example, manufacturing steps described below can be used.

The buffer layer BF is formed on the transparent glass substrate 40A, and then the active layers 32A and 62A are formed on the buffer layer BF. The gate insulating films 33A and 63A are formed on these active layers 32A and 62A. Furthermore, the gate electrodes 34A and 64A are formed on the gate insulating films 33A and 63A, an the interlayer insulating film 65A is formed on the gate insulating films 33A and 63A so as to cover the gate electrodes 34A and 64A. Then, the power supply line L3 and the drain electrode 3d are formed, and the planarization insulating film 66A is formed to cover the power supply line L3 and the drain electrode 3d. The anode 12A is formed on the planarization insulating film 66A, the emissive layer 13A is laminated on the anode 12A, and the transparent cathode 14A is formed thereon. Furthermore, the transparent cathode 14A of the display organic EL element 11A is formed on the planarization insulating film 66A above the light sensor 31A so that external light can be blocked from entering the back surface of the light sensor 31A.

As described above, in this embodiment, the display portion 10, the light source portions 20x and 20y, and the light detecting portions 30x and 30y are formed on the same transparent glass substrate 10A integrally, so that the number of the components of the organic EL display device and complexity of the manufacturing steps can be reduced. Furthermore, the reflecting boards 51x, 51y, 52x, and 52y lead light emitted by the light source portions 20x and 20y through the back surface of the light detecting portions 30x and 30y (the same side as the back surface of the display panel 1 where no external light enters), so that an effect of external light can be prevented when the emitted light is detected. It is noted that the effect of the external light can be further prevented by providing the black matrix on each of the organic EL elements in a region other than the light detecting portions 30x and 30y.

Accordingly, accuracy in positional detection of the pointing object PT that touches or is placed close to the display portion 10 can be improved. Furthermore, the active layer 32A of the light sensor 31A is placed in a position where light is not blocked by the gate electrode 34A (top gate type TFT), so that an area receiving light to be detected can be increased. This improves sensitivity in detection of entering light.

Next, a second embodiment of the invention will be described. In the first embodiment described above, the top emission type display organic EL element and the top emission type light source organic EL element, the top gate type driving TFT, and a light sensor formed of a top gate type TFT are integrally formed on the same substrate. In this embodiment, however, the display organic EL element and the light source organic EL element are of bottom emission type, the driving TFT is formed of a top gate type TFT, and the light sensor is formed of a bottom gate type TFT, all being integrally formed on the same substrate.

This embodiment will be described in detail with reference to drawings. The plan view of FIG. 1A applies to a plan view of this embodiment where the display organic EL element 11A, the light source organic EL element 21A, and the light sensor 31A in FIG. 1A are changed to the bottom emission type display organic EL element 11B, the bottom emission type light source organic EL element 21B, and the light sensor 31B formed of a bottom gate type TFT, respectively.

Figure 5A:
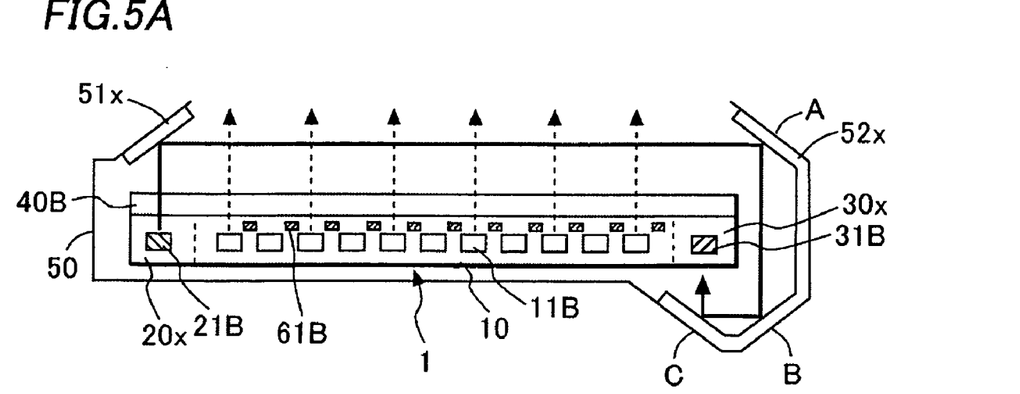
FIGS. 5A and 5B are schematic cross-sectional views of an organic EL display device of a second embodiment along line A—A and line B—B in the plan view, respectively.
Figure 5B:
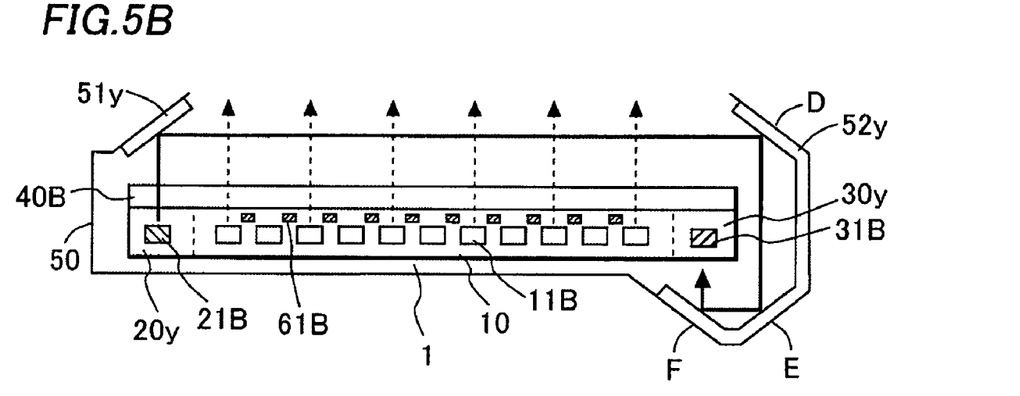

FIG. 5A is a schematic cross-sectional view of FIG. 1A for this embodiment along line A—A, and FIG. 5B is a schematic cross-sectional view of FIG. 1A for this embodiment along line B—B.

As shown in FIGS. 5A and 5B, the display portion 10, the light source portions 20x and 20y, and the light detecting portions 30x and 30y are provided on the same transparent glass substrate 40B, being integrally formed as a display panel 1. This configuration reduces the number of components of the organic EL display device, reducing complexity of manufacturing steps, in a manner similar to the first embodiment. The transparent glass substrate 40B of this embodiment is different from the transparent glass substrate 40A of the first embodiment, and is formed on the front surface of the display panel 1 as an emissive surface.

Structures of the container 50 and the reflecting boards 51x, 52x, 51y, and 52y are the same as those shown in the schematic cross-sectional views of FIGS. 1B and 1C of the first embodiment.

A detecting process of the point P corresponding to a position where the pointing object touches or is placed close to the display portion 10 in this embodiment is the same as that of the first embodiment.

Figure 6:
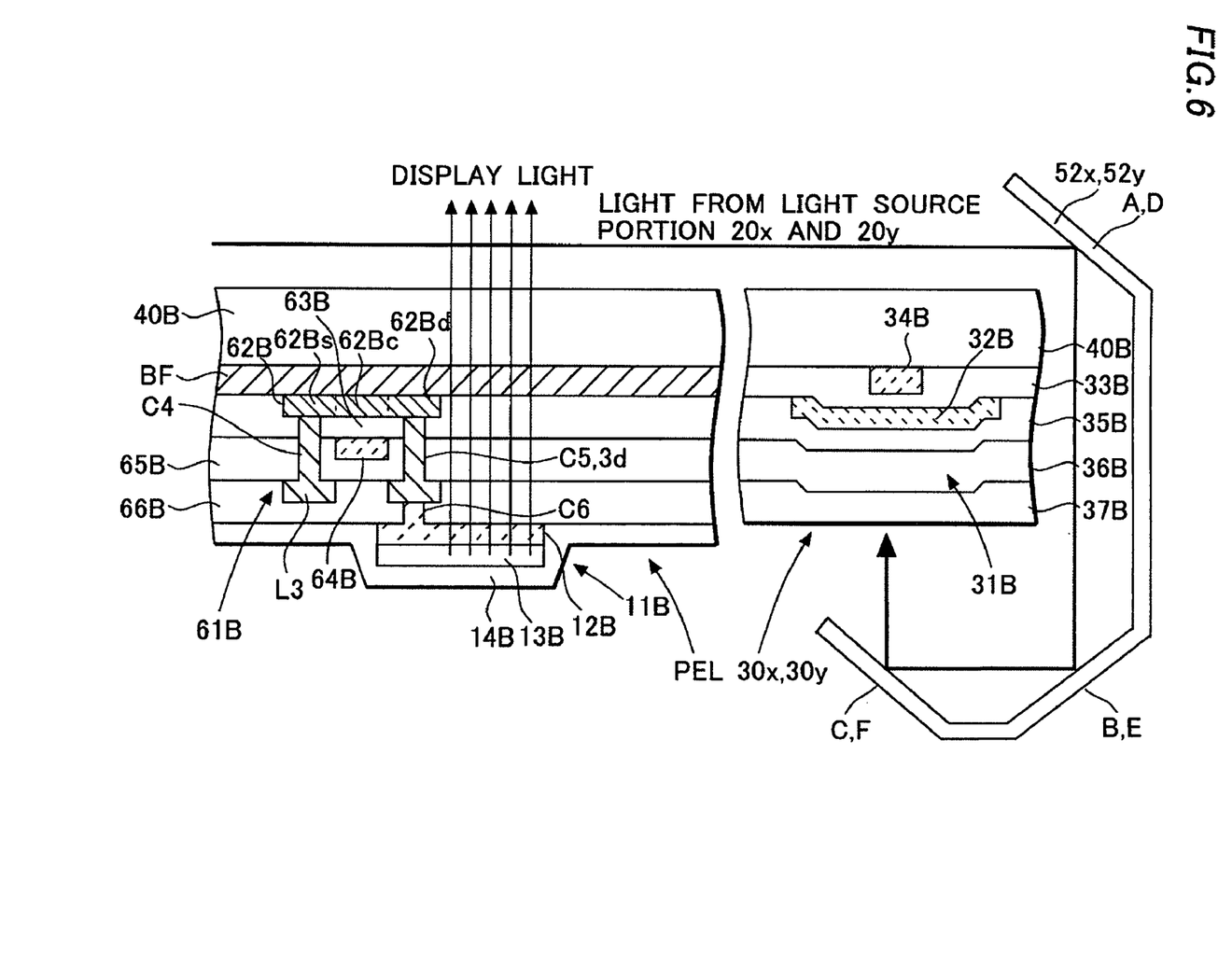
FIG. 6 is a schematic cross-sectional view of a display organic EL element and a light sensor of the second embodiment of the invention.

Next, structures of the display organic EL element 11B, the driving TFT 61B, and the light sensor 31B of the display pixel PEL will be described in detail with reference to a schematic cross-sectional view. The operation of the display pixel PEL is the same as that of the first embodiment.

FIG. 6 is a schematic cross-sectional view of the display organic EL element 11B and the driving TFT 61B of the display pixel PEL, and the light sensor 31B of the light detecting portions 30x and 30y and its neighborhood. FIG. 6 shows one of the display pixels PEL arrayed in a matrix on the display portion 10. The display organic EL element 11B of the display pixel PEL is of bottom emission type, and the driving TFT 61B for driving the display organic EL element 11B is of top gate type. Although not shown, the pixel selecting TFT 71B is of top gate type in a manner similar to the driving TFT 61B. The light sensor 31B is formed of a bottom gate TFT.

These display organic EL element 11B, the driving TFT 61B, the pixel selecting TFT 71B, and the light sensor 31B are disposed on the same transparent glass substrate 40B. In this embodiment, differing from the first embodiment, light released by the display organic EL element 11B is emitted from the exposed surface of the transparent glass substrate 40B. These elements will be described in detail hereafter.

A buffer layer BF formed by laminating, for example, $SiN_x$ and $SiO_2$ in this order, an active layer 62B formed by poly-crystallizing an a-Si film by laser beam irradiation, a gate insulating film 63B, and a gate electrode 64B made of metal having a high melting point such as chromium or molybdenum are formed on the transparent glass substrate 40B, in this order. A channel 62Bc, a source 62Bs, and a drain 62Bd are provided in the active layer 62B, the source 62Bs and the drain 62Bd being disposed on sides of the channel 62Bc, respectively.

An interlayer insulating film 65B laminated with an $SiO_2$ film, an $SiN_x$ film, and an $SiO_2$ film in this order is formed on the whole surfaces of the gate insulating film 63B and the gate electrode 64B. A contact hole C4 is provided in the interlayer insulating film 65B in a position corresponding to the source 62Bs, and the power supply line L3 to be supplied with a positive power supply voltage PVdd is provided therein by filling the hole with a metal such as Al.

A contact hole C5 is provided in the interlayer insulating film 65B in a position corresponding to the drain 62Bd, and a drain electrode 3d is provided therein by filling the hole with a metal such as Al. Furthermore, a planarization insulating film 66B made of, for example, organic resin and planarizing a surface is provided on the whole surface. A contact hole C6 is provided in the planarization insulting film 66B in a position corresponding to the drain electrode 3d, and metal such as Al fills the hole so that the drain electrode 3d and the transparent anode 12B of the display organic EL element 11B are in contact with each other. The transparent anode 12B is a transparent electrode formed of ITO (indium tin oxide).

The display organic EL element 11B is formed in each of the display pixels PEL, being isolated as an island. This display organic EL element 11B is formed by laminating the transparent anode 12B, an emissive layer 13B, and the cathode 14B (e.g. formed of Al or magnesium-indium alloy) reflecting light emitted from the emissive layer 13B without transmission, in this order. The cathode 14B is supplied with a power supply voltage CV (not shown). Light emitted by the emissive layer 13B is released from the transparent glass substrate 40B through the transparent anode 14B.

A light sensor 31B is provided on the transparent glass substrate, which is also formed with the driving TFT 61B and the display organic EL element 11B, in a position corresponding to the light detecting portions 30x and 30y. The light sensor 31B is formed of a bottom gate type TFT.

The gate electrode 34B made of metal having a high melting point such as chromium or molybdenum, the gate insulating film 33B serving as the buffer layer BF, the active layer 32B formed by poly-crystallizing an a-Si film by irradiating laser beams thereto, the insulating films 35B and 36B, and the planarization insulating film 37B are formed on the transparent glass substrate 40B, in this order. Light from the light source portions 20x and 20y enters the active layer 32B through the back surface of the display panel 1, i.e. through an exposed surface on the side of the cathode 14B. The light sensor 31B electrically detects the light received by the active layer 32B, and outputs an electric current or a voltage corresponding to intensity of the light.

In the structure of this light sensor 31B, the gate electrode 34B for blocking light does not exist between the exposed surface of the back surface of the display panel 1 where light enters and the active layer 32B. This increases the area of the active layer 32B receiving light and improves sensitivity in light detection compared with a case where the light sensor 31B is formed of a top gate type TFT (not shown) (laminated with the glass substrate, the active layer, the gate insulating film, and the gate electrode, in this order).

The light sensor 31B and the driving TFT 61B can be manufactured by manufacturing steps described below, for example. The gate electrode 34B is formed on the transparent glass substrate 40B, and then the buffer layer BF serving as the gate insulating film 33B is formed to cover the gate electrode 34B. The active layers 32B and 62B are formed thereon, and the insulating film 35B serving as the gate insulating film 63B is formed on the active layers 32B and the 62B. Furthermore, the gate electrode 64B is formed thereon, and the insulating film 36B serving as the interlayer insulating film 65B is formed to cover the gate electrode 64B. Then, the power supply line L3 and the drain electrode 3d are formed, and the planarization insulating films 37B and 66B are formed to cover the power supply line L3 and the drain electrode 3d. The transparent anode 12B is formed on the planarization insulating film 66B, the emissive layer 13B is laminated on the transparent anode 12B, and the cathode 14B is formed thereon.

As described above, in this embodiment, the display portion 10, the light source portions 20x and 20y, and the light detecting portions 30x and 30y are formed on the same transparent glass substrate integrally, so that the number of the components of the organic EL display device can be reduced and complexity of the manufacturing steps can be suppressed. Furthermore, the reflecting boards 51x, 51y, 52x, and 52y let light emitted by the light source portions 20x and 20y enter the back surface of the light detecting portions 30x and 30y (the same side as the back surface of the display panel 1 where no external light enters) in a manner similar to the first embodiment, so that a detection error caused by an effect of external light can be prevented. Accordingly, accuracy in positional detection of the pointing object that touches or is placed close to the display portion 10 can be improved. Furthermore, the active layer 32B of the light sensor 31B is placed in a position where light is not blocked by the gate electrode 34b (bottom gate type TFT), so that an area receiving light to be detected can be increased. This improves sensitivity in detection of entering light.

The reflecting boards 52x and 52y provided near the light detecting portions 30x and 30y in the first and second embodiments have reflecting surfaces which reflects light incident horizontally along the display panel 1 in a vertical direction, next reflects the light in a horizontal direction, and last reflects the light in a vertical direction to enter the light in the light detecting portions 30x and 30y of the back surface of the display panel 1. However, reflecting angles of the other reflecting surfaces A, B, D, and E can be angles other than vertical or horizontal as far as the light can vertically enter the light detecting portions 30x and 30y through the back surface of the display panel 1.

The embodiments described above can be applied to a non-organic electroluminescent display device using a non-organic material as an emissive layer.

What is claimed is:

1. An electroluminescent display device comprising:
   a display portion comprising a plurality of display pixels arranged in a matrix, each of the pixels comprising a display electroluminescent element and a driving transistor driving the display electroluminescent element;
   a light source portion comprising a plurality of light source electroluminescent elements and provided along a first side of the display portion;
   a light detecting portion comprising a plurality of light sensors and provided along a second side of the display portion, the second side being opposite from the first side,
   wherein the display portion, the light source portion and the light detecting portion are disposed on a substrate;
   a first reflecting board reflecting light emitted by the light source portion in a horizontal direction along a front surface of the substrate across the display portion; and
   a second reflecting board reflecting the light reflected by the first reflecting board so as to lead the light into the light detecting portion through a back surface of the substrate.

2. The electroluminescent display device of claim 1, wherein the display electroluminescent element is of a top emission type, the driving transistor comprises a thin film transistor of a top gate type, and the light sensor comprises a thin film transistor of a top gate type.

3. The electroluminescent display device of claim 1, wherein the display electroluminescent element is of a bottom emission type, the driving transistor comprises a thin film transistor of a top gate type, and the light sensor comprises a thin film transistor of a bottom gate type.

4. The electroluminescent display device of claim 1, wherein the first and second reflecting boards are provided along the first and second sides of the display portion, respectively.

5. The electroluminescent display device of claim 2, wherein the first and second reflecting boards are provided along the first and second sides of the display portion, respectively.

6. The electroluminescent display device of claim 3, wherein the first and second reflecting boards are provided along the first and second sides of the display portion, respectively.

7. The electroluminescent display device of claim 1, wherein the second reflecting board is configured to cover an edge of the display portion at the second side of the display portion.

* * * * *